United States Patent [19]

Toth

[11] 4,291,389

[45] Sep. 22, 1981

[54] MEMORY SYSTEM USING FAULTY BUBBLE MEMORY DEVICES

[75] Inventor: Dolan H. Toth, Circle Pines, Minn.

[73] Assignee: Control Data Corporation, Minneapolis, Minn.

[21] Appl. No.: 96,099

[22] Filed: Nov. 20, 1979

[51] Int. Cl.³ .............................................. G11C 19/08
[52] U.S. Cl. ....................................... 365/15; 365/200
[58] Field of Search ............................. 365/15, 2, 200

[56] References Cited

U.S. PATENT DOCUMENTS 4,073,012 2/1978 Ohnigian et al. ...................... 365/15
4,233,669 11/1980 Furukawa et al. .................... 365/15

OTHER PUBLICATIONS

IBM Technical Disclosure Bulletin–vol. 18, No. 9, Feb. 1976, pp. 3079–3081.
IBM Technical Disclosure Bulletin–vol. 19, No. 12, May 1977, pp. 4758–4761.

Primary Examiner—James W. Moffitt
Attorney, Agent, or Firm—Joseph A. Genovese; William J. McGinnis, Jr.

[57] ABSTRACT

This invention uses a plurality of bubble memory chips in a system for providing simultaneous input and output in a word or byte organized output. Each bubble memory chip has the same number of minor loops as is required for nominal memory size without the requirement for extra or redundant loops. Each bubble memory chip may have a number of faulty minor loops where the bit output is incorrect and cannot be used. However, a requirement for this system is that no two bubble memory chips may have a faulty bit or minor loop at the same major loop address location. An additional bubble memory chip is provided which will contain the correct data bits for locations corresponding to defective major loop addresses in the bubble memory chips making up the byte. A Programmable Read Only Memory (PROM) is provided and connected with a logic network to control the gating of the outputs of the bubble memory chips associated with the memory byte and the extra bubble memory chip to control the gating of the outputs. Thus, as contents of the various bubble memory chips are addressed, the PROM controls the gating of the bits forming the output byte or word so that the output byte or word is comprised of only correct bits.

2 Claims, 2 Drawing Figures

☐ DENOTES A BAD BIT LOCATION

✗ DENOTES A LOGICAL "DONT CARE" CONDITION, THE BIT MAY BE 1 OR 0 AND THE OPERATION WILL BE INDENTICAL.

MEMORY SYSTEM USING FAULTY BUBBLE MEMORY DEVICES

BACKGROUND OF THE INVENTION

This invention relates to bubble memory systems organized on a word or byte basis. Herein a byte is defined as eight bits. A word can be any arbitrary number of bits. In particular, this invention relates to a system which allows defective, individual bubble memory chips to be used in a system wherein a logic system combined with a Programmable Read Only Memory (PROM) and an extra bubble memory chip provide a fault tolerance capability such that the output of the bubble memory system provides correct words or bytes.

In conventional manufacturing processes for bubble memory chips, a certain number of chips will be defective. Normal manufacturing control requires a trade-off between manufacturing 100 percent perfect devices and testing after the manufacturing process to find defective but useable units. Various designs in the prior art exist to increase the yield of useable chips by designing bubble memory chips in such a way that some number of faults or defects may exist and yet have the chip useable in the particular bubble memory system. Many such fault tolerant designs exist employing both external logic and memory as well as various modifications of a standard chip design or combinations of both.

The present invention involves a system wherein the testing process for the bubble memory chips will produce a map or list of the defective major loop address locations for each chip and wherein the chips can be sorted so that the chips comprising a byte or word of a memory may be selected so that no two or more chips have defective bits in the same major loop address positions. In the present invention each bubble memory chip need only have the number of major loop bit locations as required to maintain the nominal memory size.

U.S. Pat. No. 3,909,810 shows a scheme wherein extra minor loops are included in each chip in a bubble memory system and an external memory source is used together with logic devices to identify minor loops which are to be ignored in favor of usable minor loops. Thus, all of the fault tolerant ability of the system shown in this patent is based on external logic devices combined with the necessity of having bubble memory chips containing an excess number of minor loops.

In another form of fault tolerant capability, U.S. Pat. No. 3,792,450 shows the use of a major loop, minor loop memory system having additional minor loops which are used for the purpose of containing a flaw table to identify the minor loop locations which are defective. This system provides for additional complexity to the individual bubble memory chips in that additional connections and read gates are required on the chip to allow for independent reading of the minor loop flaw tables. Thus, further care in design and construction of individual bubble memory chips is required to ensure that proper synchronization is maintained between the redundant loops and the remainder of the memory so that the correct correspondence is maintained and identify between indications of faulty loops and the actual loops which are defective.

The present invention has many advantages over the type of fault tolerant system shown in U.S. Pat. No. 3,909,810 in that a bubble memory device is not required to serve as a flag chip containing only information about defective byte locations. The present invention uses only bubble memory chips for storage of data. The defect map memory device or flaw table, as it is sometimes called, of the present invention is contained in a PROM memory. Similarly, the present invention has advantages over systems involving extra or redundant minor loops in bubble memory devices because such systems require some type of mechanism for compacting data or buffering data in order to compensate for interruptions in the regular flow of data from a bubble memory when a bit location is skipped as the device is read in a serial fashion.

SUMMARY OF THE INVENTION

The present invention employs a plurality of bubble memory chips, each of which may contain defective bit locations, organized to read or write a word or byte in bit parallel mode. An additional bubble memory chip is provided which holds correction bits to compensate for defective bits in the primary bubble memory chip devices. Defective bits cannot be allowed to occur at the same address location in more than one bubble memory device and accordingly the chips are preselected so that defective bit locations do not occur at the same byte or word address. A Programmable Read Only Memory (PROM) is provided in the address system so that for each address containing a defective bit in one of the primary bubble memory chips, a correction bit will be provided from the correction bit bubble memory chip to replace the bit in error. Thus, for an 8-bit word organization, a group of 9 bubble memory chips will be provided. A PROM will also be provided having a 4-bit output. Three bits of the PROM output will be used to select one of eight bubble memory chips having a defective location and the fourth PROM bit will be used to cause a transfer of data from the correction bit chip to the selected bit of the output word. This fourth bit will allow for the condition where none of the bubble memory chips has a defective bit at the particular memory location and in which no transfer will be required.

The system works the same in reverse when data is being written into the memory. If a particular address is accessed where one of the bubble memory chips is known to have a defective bit location, that bit is written into the correction bit bubble memory chip, instead of the usual chip having the faulty location.

IN THE FIGURE

FIG. 1 is a block schematic diagram of an embodiment of the present invention,

DESCRIPTION OF THE PREFERRED EMBODIMENTS

Figure 2:
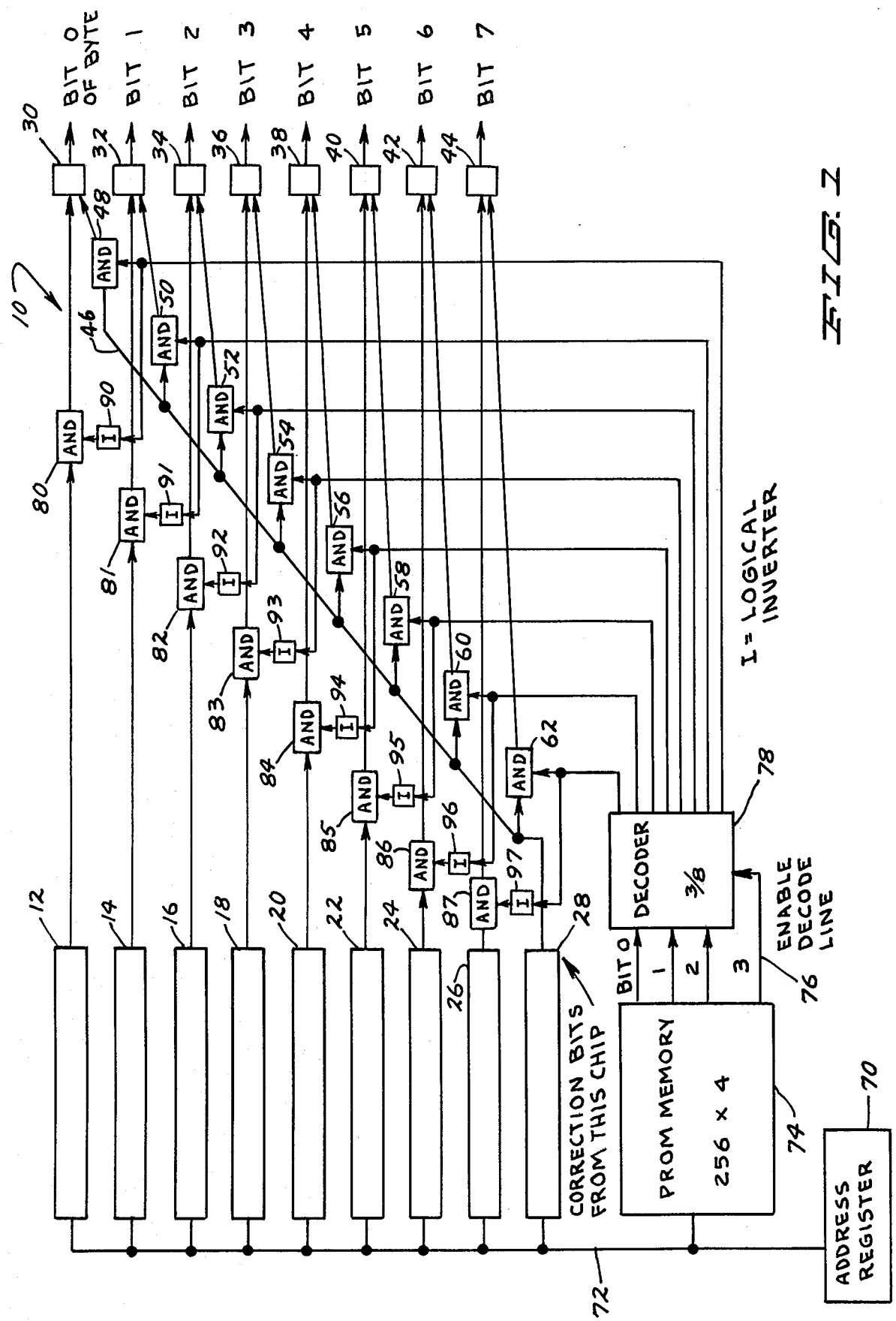
FIG. 2 is a logic chart illustrating the operation of the embodiment of the present invention shown in FIG. 1.
Figure 2:
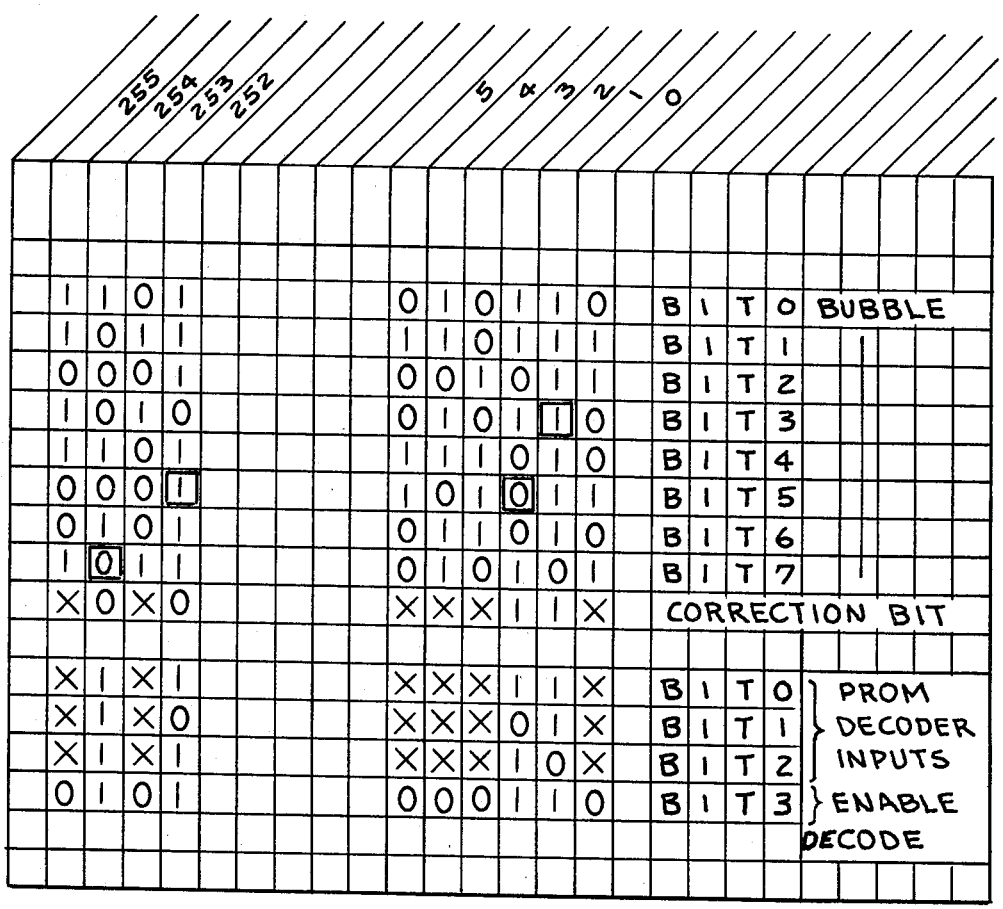

Referring now to FIG. 1, an embodiment 10 of the present invention is shown. A plurality of bubble memory chips 12, 14, 16, 18, 20, 22, 24 and 26 provide the individual bit outputs of a byte or word organized memory. By way of example only, FIG. 1 shows an 8-bit system in which 8 bubble memory chips are provided plus an additional ninth bubble memory chip 28 is provided for the purpose of containing correction bits to be read in to and read out of the memory system in place of bits on chips 12 through 26. Any of the nine bubble memory chips may contain defective bits. The output of each of bubble memory chips 12 through 26 is connected to a bit location in an output register. Bit locations 30, 32, 34, 36, 38, 40, 42 and 44 are provided to be associated with bubble memory chips 12 through 26, respectively. Bubble memory chip 28 containing correction bits is connected with a correction bit line 46. The correction bit line 46 provides an input to each of a plurality of AND gates 48, 50, 52, 54, 56, 58, 60 and 62. Each of the AND gates 48 through 62 has a data output connected to one of the bits 30 through 44, respectively, of the output register. In addition another path to the output register exists through AND gates 80, 81, 82, 83, 84, 85, 86 and 87 which is the normal path from the bubble memory chips 12 through 26 in the absence of errors.

A system organized according to the present invention receives an input address generally from an address register 70. The address register 70 provides addresses on an address bus 72 which is connected with each of bubble memory chips 12 through 28. Address bus 72 also provides an input to a Programmable Read Only Memory (PROM) 74. By way of example for the present invention, the PROM 74 has a 4-bit output and it may have an address range of 256 addresses. One of the outputs of PROM 74 is provided on a line called the Enable decode line 76 in the figure which is connected with decoder 78. Enable decode line 76 enables the decoder 78 which decodes input bits 0-2 into an enable signal on only one of the eight output lines. The seven remaining decoder output lines are disabled. Hence, the particular enabled AND gate of AND gates 48 through 62 channels the correction bit to the appropriate bit of the output register. The seven bits which are disabled cause their respective AND gates of AND gates 80 through 87 to be enabled because of the logical inversion performed by inverters 90, 91, 92, 93, 94, 95, 96 and 97 on the signal from decoder 78.

When the Enable decode line 76 is disabled, all decoder lines are disabled and consequently all AND gates 80 through 87 are enabled causing normal data flow from bubble memory chips 12 through 26 to the output register bits 30 through 44.

Referring now to FIG. 2, an example of the operation and required contents of the PROM is shown with reference to the embodiment of the invention of FIG. 1 in order to effect the correction process. Bits corresponding to bad minor loops are encompassed by the square symbol shown in the FIG. while an X is shown in the FIG. for a logical "don't care" condition indicating that the result will be unchanged regardless of the PROM outputs going to the decoder.

For the purpose of illustration in FIG. 2, the major loop addresses in the bubble memory chips assumed to be bad are 1, 2, 252 and 254. Bit 3 of the PROM 74 as shown in FIG. 1 contains binary 1's only for these addresses and 0's for all others. The bits in error are (in right-to-left order): 3, 5, 5, 7. This corresponds to register location 36, 40, 40, and 44 as shown in FIG. 1. The first 3 bits of the PROM 74, namely bits 0-2, contain these faulty bit locations at the respective bad major loop address locations. No modification of the data byte is required for bytes at major loop addresses where faulty bits are not present and thus a large number of "don't care" bits may exist in the correction bit bubble chip 28.

Bit 3 at major loop address 1 shows a binary 1, in FIG. 2, and the correction bit is also a binary 1. Bit 5 at address 2 shows a binary 0 which is corrected to be a binary 1 using a correction bit from the correction bit chip 28. Bit 5 at address 252 shows a binary 1 which is corrected to be a binary 0 using a correction bit from chip 28. Bit 7 at address 254 shows a binary 0 corrected, coincidently, to be a binary 0. Note that the correction bit may or may not be the same as the faulty bit from the particular bubble memory chip 12 through 26. The object of the correction system is that the veracity of the error bit cannot be trusted whereas the correction bit is known to be correct.

For writing into the memory system, the sequence of operations as shown in FIG. 1 is merely reversed. The same PROM memory 74 is used to designate which bits need to be written into the correction bit chip 28 instead of, or alternatively in addition to, the normal bubble loop chip. The present invention has the very distinct advantage that no extra minor loops are required in the bubble memory chips to provide redundancy such as used in the prior art. When extra minor loops are required in addition to nominal memory size, comparatively complex methods and hardware are needed to ensure synchronization of the output of a word or byte organized memory and such systems require data deskewing or buffering techniques in order to provide for proper data flow. The present invention automatically provides for bit synchronization and comparatively little additional hardware is required to implement the operation of the correction bit bubble memory chip 28.

What is claimed is:
1. A word organized, fault tolerant bubble memory system comprising:
   a plurality of bubble memory chips, each having the same number of minor loops as is required for a nominal memory size, equivalent in number to the word size of the memory system,
   a correction bit bubble memory chip,
   memory means responsive to input addresses for identifying defective bit locations in said plurality of bubble memory chips,
   means for providing addresses to said memory means and to said memory system,
   means for substituting, in reading and writing operations, correction bits from said correction bit bubble memory chip for bits in any one of said plurality of bubble memory chips in response to output signals from said memory means identifying a defective bit location, wherein said means for substituting is comprised of a decoder associated with an output address from said memory means for identifying a particular one of said plurality of bubble memory chips having a defective location and logic gate means which in response to a signal from said decoder connects said correction bit chip with the appropriate input or output of said memory system in reading and writing operations, said logic gate means being comprised of AND gates associated with each of said bubble memory chips, each of said AND gates receiving a common data bit input from said correction bit bubble memory chip and a unique input from said decoder for gating said input in response to an enable signal from said decoder together with AND gate means for disabling the output from any one of said bubble memory chips in response to an inverted enable signal from said decoder when a bit from said correction bit chip is to be gated.

2. The apparatus of claim 1 and further comprising means for disabling said decoder when no correction bit is to be gated.

* * * * *